United States Patent
Sardesai et al.

(10) Patent No.: US 6,342,131 B1
(45) Date of Patent: *Jan. 29, 2002

(54) METHOD OF DEPOSITING A MULTILAYER THIN FILM BY MEANS OF MAGNETRON SPUTTERING WHICH CONTROLS THE MAGNETIC FIELD

(75) Inventors: Viraj Y. Sardesai, Poughkeepsie, NY (US); Tomio Y. Katata, Yokohama (JP); Christopher Parks, Beacon; John Benedict, New Paltz, both of NY (US)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/061,980

(22) Filed: Apr. 17, 1998

(51) Int. Cl.$^7$ ............................................. C23C 14/34
(52) U.S. Cl. ........................... 204/192.12; 204/192.15; 204/192.2
(58) Field of Search ....................... 204/192.12, 192.15, 204/298.12, 298.13, 298.2, 298.22, 192.2

(56) References Cited

U.S. PATENT DOCUMENTS

| 4,275,126 A | | 6/1981 | Bergmann et al. ............. 429/30 |
| 4,444,635 A | * | 4/1984 | Kobayashi et al. ....... 204/298.2 |
| 4,444,643 A | | 4/1984 | Garrett ........................ 204/298 |
| 4,500,408 A | | 2/1985 | Boys et al. .................. 204/298 |
| 4,595,482 A | | 6/1986 | Mintz ......................... 204/298 |
| 4,606,802 A | * | 8/1986 | Kobayashi et al. ...... 204/192.12 |
| 4,714,536 A | | 12/1987 | Freeman et al. ............. 204/298 |
| 4,734,183 A | | 3/1988 | Wirz et al. .................. 204/298 |
| 4,740,268 A | | 4/1988 | Bukhman ................... 156/643 |
| 4,761,218 A | | 8/1988 | Boys ........................... 204/298 |
| 4,829,215 A | | 5/1989 | Kim et al. .............. 315/111.41 |
| 4,865,710 A | | 9/1989 | Aaron et al. ............ 204/192.12 |
| 4,927,513 A | | 5/1990 | Schultheiss et al. .... 204/192.13 |
| 4,956,070 A | | 9/1990 | Nakada et al. ......... 204/298.18 |
| 4,957,605 A | | 9/1990 | Hurwitt et al. ......... 204/192.12 |
| 5,106,470 A | | 4/1992 | Takei et al. ............. 204/192.12 |
| 5,130,005 A | | 7/1992 | Hurwitt et al. ......... 204/192.12 |
| 5,171,415 A | | 12/1992 | Miller et al. ........... 204/298.09 |
| 5,173,641 A | | 12/1992 | Imahashi et al. ....... 315/111.41 |

(List continued on next page.)

OTHER PUBLICATIONS

M. Koike et al., "Nanofabrication of Multilayer Zone Plates by Helicon Plasma Sputtering", Jpn. J. Appl. Phys. vol. 34 (1995) pp. 6754–6757.*
B. Lal et al., "Magneticand recording properties of monolayer and multilayer thin–film media by using composite targets", J. Appl. Phys 79 (8), Apr. 15, 1996, pp. 5336–5538.
F. Bijkerk et al, "Extreme UV lithography: a new laser plasma target concept and fabrication of multilayer reflection masks", Microelectronic Engineering 30 (1996) pp. 183–186.

Primary Examiner—Nam Nguyen
Assistant Examiner—Gregg Cantelmo
(74) Attorney, Agent, or Firm—Banner & Witcoff, Ltd.

(57) ABSTRACT

A thin film deposition method comprises the steps of preparing a magnetron sputtering system having a magnetic field generation unit for changing a magnetic field, mounting, as a target, a composite material on a cathode of the magnetron sputtering system, providing a to-be-processed substrate on an anode of the magnetron sputtering system, evacuating a chamber of the magnetron sputtering system and thereafter filling the chamber with inert gas, and applying, onto the cathode, one of DC power and RF power and, at the same time, an alternating magnetic field from a lower portion of the target, thereby controlling a cycle and intensity of the alternating magnetic field to change a ratio of the not less than two components of the thin film in a film thickness direction of the thin film.

11 Claims, 8 Drawing Sheets

U.S. PATENT DOCUMENTS

| | | | |
|---|---|---|---|
| 5,182,001 A | 1/1993 | Fritsche et al. | 204/192.12 |
| 5,208,512 A | 5/1993 | Forster et al. | 315/111.41 |
| 5,262,030 A | 11/1993 | Potter | 204/298.2 |
| 5,282,947 A | 2/1994 | Brugge et al. | 204/298.2 |
| 5,328,585 A | 7/1994 | Stevenson et al. | 204/298.2 |
| 5,455,197 A | 10/1995 | Ghanbari et al. | 437/192 |
| 5,527,605 A * | 6/1996 | Doessel et al. | 204/192.2 |
| 5,630,916 A | 5/1997 | Gerrish et al. | 204/192.2 |
| 5,762,766 A * | 6/1998 | Kurita et al. | 204/192.2 |

* cited by examiner

| ZONE | R | MAGNETIC FIELD | MAX.CURRENT |
|---|---|---|---|
| 1 | 19mm FROM CENTER | 156 GAUSS | 4 AMP. |
| 2 | 68mm FROM CENTER | 270 GAUSS | 0.5 AMP. |
| 3 | 125mm FROM CENTER | 570.5 GAUSS | 10 AMP. |

FIG. 5

| MAGNETIC SWEEP TIME | NUNBER OF LAYERS | LAYER THICKNESS |
|---|---|---|
| 4 SEC | 8.0 | 10.6 nm |
| 5 SEC | 6.0 | 14.7 nm |
| 7 SEC | 4.2 | 21.0 nm |
| 9 SEC | 3.4 | 25.0 nm |

| MAGNETIZATION CURRENT (PERCENT OF MAXIMUM CUR.) | PEAK TO VALLEY SIMS CONCENTRATION RATIO FOR A COMPONENT |
|---|---|
| 60 % | 1.45 |
| 75 % | 1.66 |
| 90 % | 1.5 |
| 100 % | 1.55 |

METHOD OF DEPOSITING A MULTILAYER THIN FILM BY MEANS OF MAGNETRON SPUTTERING WHICH CONTROLS THE MAGNETIC FIELD

BACKGROUND OF THE INVENTION

The present invention relates to a multilayer thin film and a sputtering deposition method thereof. In particular, the present invention relates to a method of depositing a multilayer thin film by means of magnetron sputtering which controls the magnetic field.

At present, a multilayer film is formed by depositing it with an evaporation or a sputtering method using two or more different materials. When two or more materials are deposited, two or more sputtering cathodes are needed (as taught by, for example, Masaki Koike et al. "Nanofabrication of Multilayer Zone Plates by Helicon Plasma Sputtering" Jpn. J. Appl. Phys. Vol. 34 (1995), pp. 6754–6757). The reference discloses a technique of forming multilayer zone plates by depositing alternately Ag layers and Al layers with the sputtering technique which employs two helicon cathodes. In addition, a one cathode technique using composite targets is proposed (as taught by, for example, Brij. B. Lai et al. "Magnetic and recording properties of monolayer and multilayer thin-film media by using composite targets. J. Appl. Phys. 79(8), Apr. 15, 1995, pp. 5336–5338). The reference discloses a method of forming a magnetic film with Cr as an underlayer using concentric annular shaped composite targets of Cr and magnetic materials.

The use of two or more cathodes, however, makes a sputtering system complex and makes it difficult to control thicknesses of respective layers and impurity contents. That is, if two materials are deposited simultaneously, compositions within a substrate become uneven due to separation in the space. Meanwhile, if alternate deposition is conducted between two materials, interfacial films of quite low nanometer level are disadvantageously formed among the layers due to switching of deposition modes.

It is meanwhile well known that the sputtering system is a system for depositing layers of certain materials on a substrate. This includes a magnetron sputtering system utilizing a magnetic field for purposes of accelerating the sputtering rate of deposited materials. In the system, the application of a magnetic field crossing an electrical field causes electrons emitted from a cathode to make a trochoid movement and high density plasma is generated on a target, thus making it possible to increase sputtering rate with relatively low voltage.

Figure 1:
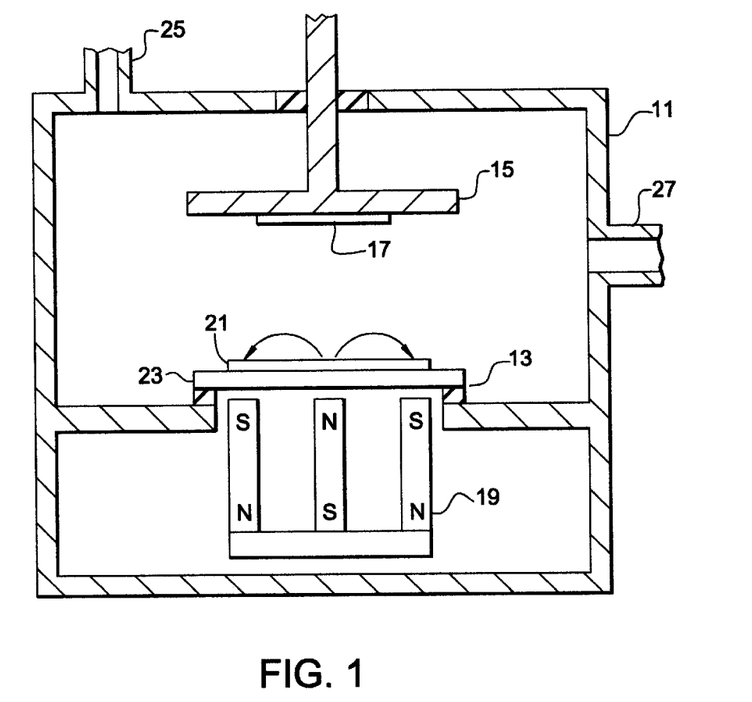
FIG. 1 is a cross-sectional view conceptually showing the structure of an ordinary magnetron sputtering system which is also employed in the present invention.

FIG. 1 is a typical magnetron sputtering system. It has a cathode section 13 and an anode 15 within a vacuum chamber 11. A to-be-processed substrate 17 is provided at the anode 15. The cathode section 13 has a plurality of magnets 19. A material 21 referred to as a target hereinafter is mounted on a susceptor 23 of the cathode section 13. In recent years, a system wherein an anode 15 and a cathode section 13 are turned upside down has been frequently used. This is because it is preferable for carrying a to-be-processed substrate.

If the system is operated, a container 11 is evacuated from an exhaust outlet and inert gas, such as argon, is injected from an injection port at low pressure. DC or RF power is applied onto the cathode section 13. The magnets 19 form a closed magnetic circuit of strong magnetic field on the surface of the target 21. If such a magnetic field exists on the target 21, then electrons make a trochoid movement and enclosed in the vicinity of the target 21 and the electrons and gas molecules collide with each other more frequently.

The inert gas within the container 11 collides with accelerated electrons and turns into ions. As a result, plasma occurs in the vicinity of the cathode section 13. Positive gas ions from the plasma, which are accelerated in the cathode section direction, collide with the target 21 and expel some of target materials out of the target 21. The expelled materials are deposited on the substrate 17.

In this way, the magnetic field increases electron density on the target 21, thereby increasing ionization ratio in this region. Although the magnetic field has been long used for improving the degree of sputtering deposition, it has been aimed only to increase the deposition rate of materials.

The magnetron sputtering system now on the market employs a fixed magnetic field or an alternating magnetic field. The fixed magnetic field is realized by installing permanent magnets to cover the entire back surface of a target as shown in the above description. It is also realized by using electromagnets through which fixed magnetizing current flows. The alternating magnetic field can be realized by moving periodically permanent magnet pieces to the back surface of the target or by using electromagnets with which a single or a plurality of coils are magnetized by periodically changing current.

As described above, sputtering rate can be increased by using the magnetic field. A method of controlling thicknesses of the layers of the multilayer film and impurity concentration with high accuracy has not been however known.

BRIEF SUMMARY OF THE INVENTION

It is therefore the first object of the present invention to provide a method of depositing a multilayer film, which method is capable of accurately controlling film thickness.

It is the second object of the present invention to provide a method of depositing a multilayer film, which method is capable of accurately controlling composition.

To attain the above objects, a thin film deposition method in the first aspect of the present invention comprises the steps of:

preparing a magnetron sputtering system having magnetic field generation means for changing a magnetic field;

mounting, as a target, a composite material including not less than two components on a cathode of the magnetron sputtering system;

providing a to-be-processed substrate on an anode of the magnetron sputtering system;

evacuating a chamber of the magnetron sputtering system and thereafter filling the chamber with inert gas; and controlling a cycle of the alternating magnetic field to change a ratio of the not less than two components of the thin film in a film thickness direction of the thin film, by applying, onto the cathode, one of DC power and RF power and, at the same time, the alternating magnetic field from a lower portion of the target.

The magnetic field generation means has an electromagnet, and the step of controlling a cycle of the alternating magnetic field can include a step of changing a cycle of magnetizing current of the electromagnet.

The magnetic field generation means has a permanent magnet, and the step of controlling a cycle of the alternating magnetic field can include a step of controlling a cycle of moving the permanent magnet below the target.

It is preferable that the composite material serving as the target is a composite metal including not less than two metal elements.

The composite metal is preferably one selected from a group consisting of WSi, CoFe, CoCu, CoCr, FeCu, FeNi, MnNi, ternary combinations of three components, CoCrTa and FeNiCoMnCu, the ternary combinations of three components including three selected from a group consisting of Co, Fe, Cu, Cr, Ni and Mn.

A multilayer thin film deposition method in the second aspect of the present invention comprises the steps of:

preparing a magnetron sputtering system having magnetic field generation means for changing a magnetic field;

mounting, as a target, a composite material including not less than two components on a cathode of the magnetron sputtering system;

providing a to-be-processed substrate on an anode of the magnetron sputtering system;

evacuating a chamber of the magnetron sputtering system and thereafter filling the chamber with inert gas; and applying, onto the cathode, one of DC power and RF power and, at the same time, an alternating magnetic field having a predetermined maximum value from a lower portion of the target to obtain a predetermined composition changing in a film thickness direction of the thin film.

The magnetic field generation means has an electromagnet, and the step of applying the alternating magnetic field can include a step of changing a maximum value of the alternating magnetic field by changing magnetizing current of the electromagnet.

It is preferable that the composite material serving as the target is a composite metal including not less than two metal elements.

The composite metal is preferably one selected from a group consisting of WSi, CoFe, CoCu, CoCr, FeCu, FeNi, MnNi, ternary combinations of three components, CoCrTa and FeNiCoMnCu, the ternary combinations of three components being selected from a group consisting of Co, Fe, Cu, Cr, Ni and Mn.

Moreover, a thin film according to the present invention includes at least two components, a composition of the components periodically changing in a film thickness direction, concentrations of the at least two components gradually changing in a common cycle in a film thickness direction of the thin film, the cycle of one of the at least two components is shifted by a predetermined rate in the film thickness direction from the cycle of the other of the at least two components.

The thin film can be formed by sweeping a magnetic field while using different sputtering directivity of the at least two components in magnetron sputtering.

The thin film can further comprise a substrate on which the thin film is formed.

The at least two components are made of metal and constitute a composite metal.

It is preferable that the composite metal is one selected from a group consisting of WSi, CoFe, CoCu, CoCr, FeCu, FeNi, MnNi, ternary combinations of three components, CoCrTa and FeNiCoMnCu, the ternary combinations of three components including three selected from a group consisting of Co, Fe, Cu, Cr, Ni and Mn.

A distance between peaks of the concentration of one of the at least two components is not more than 100 nm.

According to the present invention, the magnetic field is cycled to enhance deposition rate of one material over the other. A composite targets consisting of two or more materials is employed and parameters of the magnetic field are changed. By doing so, the relative material sputtering rate is increased and therefore a finely controlled multilayer film can be deposited.

The first aspect of the present invention is to change magnetic field sweep time and thicknesses of deposited layers. The deposited layer thickness is inversely proportional to the magnetic field sweep time.

The second aspect of the present invention is to change the relative composition of sputter species by changing magnetic force. With electromagnets, magnetic force is changed by adjusting the amplitude of input current waveform, i.e., maximum current.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Prior to the embodiments of the present invention, the gist of the present invention will be described.

According to the present invention, a well-known sputtering system is employed and a fine layered structure of several nanometer thickness of layers is provided by changing the magnetic field. with a single composite material, parameters of the magnetic field are changed to thereby realize the layer thickness and composition which have good reproducibility.

Figure 2A:
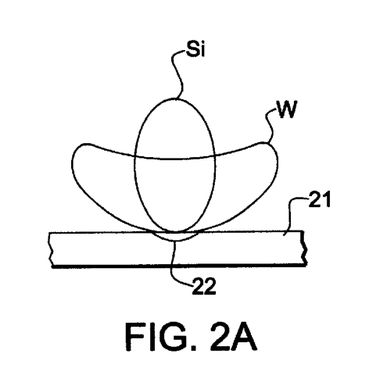
FIG. 2A is a view describing the sputtering directivity of WSi.
Figure 2B:
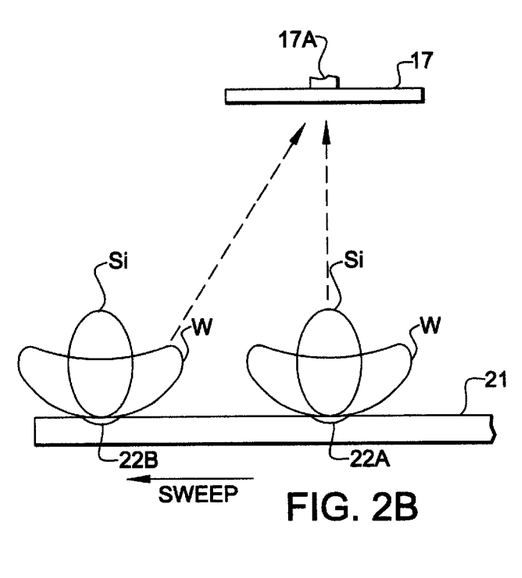
FIG. 2B is a view describing the principle of a method of forming a multilayer film by changing magnetic field.

When a target is mounted on a susceptor of the sputtering system and sputtering is started, part of the target is scattered from where electrons are concentrated and an erosion is formed on the surface of the target. At this time, if the target is made of composite material (such as WSi), different directivity emerges in sputtering direction depending on components (W and Si), as shown in FIG. 2A If the magnetic field is swept in this state, the position of the erosion 22 is moved as shown in FIG. 2B. When attention is paid to a point 17A on a substrate provided at an anode, the Si richest film is deposited right above the erosion 22A, as represented by the dashed arrow <22A–17A>. As the erosion 22 is moved from erosion point 22A to 22B in the sweep direction, film composition deposited is changed The W richest film is deposited at a portion 17A to which the erosion 22 is moved to erosion point 22B by a predetermined distance as represented by the dashed arrow <22B–17A>. Additional portions of substrate 17 are covered in this manner.

Figures 3A, 3B, 4A, 4B:
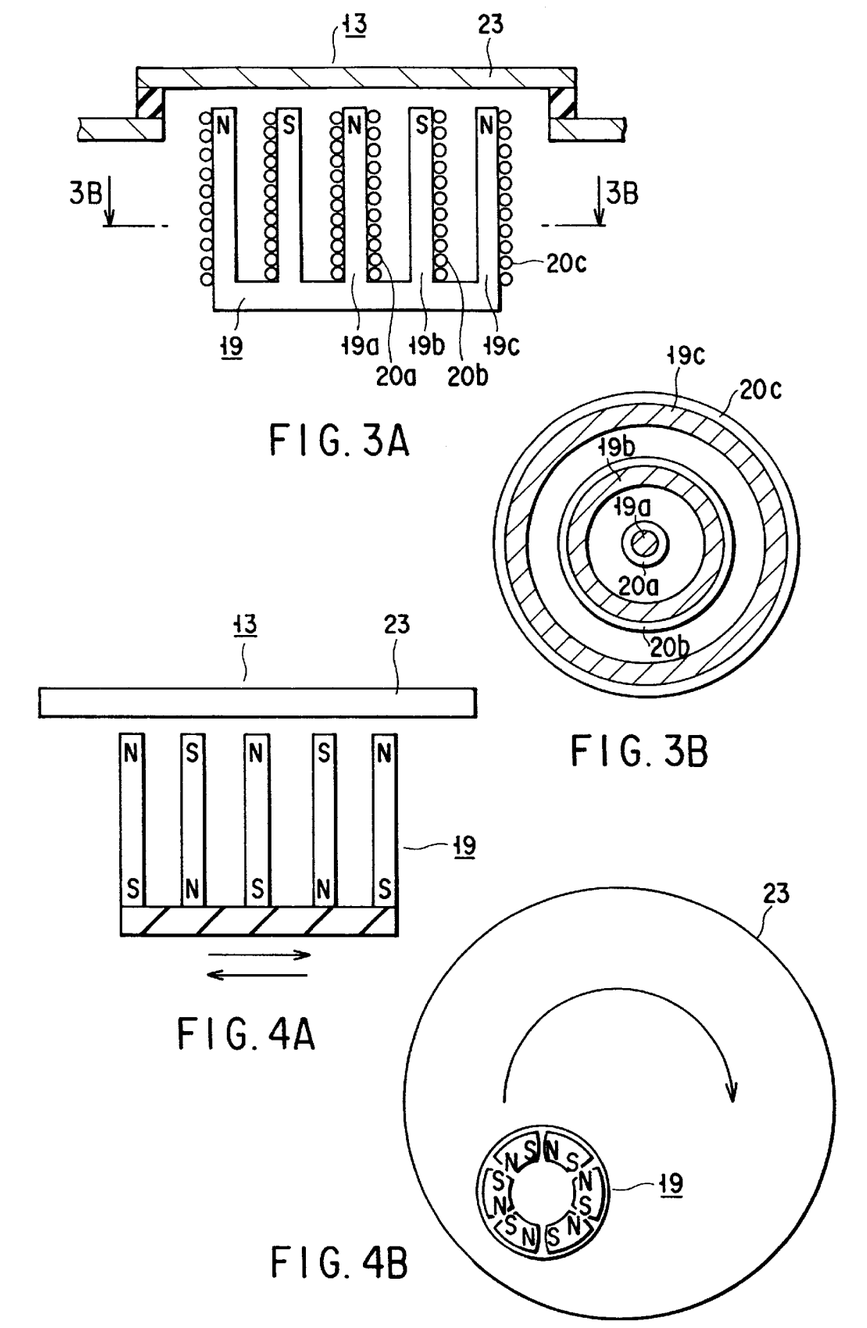
FIG. 3A is a cross-sectional view showing a cathode section of the magnetron sputtering system used in the embodiments of the present invention, which cathode section employs magnetic field generation means of electromagnet system.
FIG. 3B is a cross-sectional view taken along lines 3B—3B of FIG. 3A.
FIG. 4A is a cross-sectional view showing an example of magnetic field generation means using permanent magnets.
FIG. 4B is a plan view showing another example of magnetic field generation means using permanent magnets.

To change (or move) the magnetic field, electromagnets may be provided below a cathode section 13 as shown in FIGS. 3A and 3B. The electromagnets are made of, for example, coils 20a, 20b and 20c coiled around concentric cores 19a, 19b and 19c, respectively as shown in the plan view of FIG. 3B. Current flowing through the respective coils is controlled, whereby the position of the erosion 22 can be changed.

The movement of the magnetic field can be also realized with permanent magnets. FIG. 4A illustrates a case where permanent magnets in stead of the electromagnets are used in the structure of FIG. 3A. In FIG. 4A, the permanent magnets 19 are mechanically swept below the target 23. Alternatively, as shown in the plan view of FIG. 4B, the permanent magnets 19 are rotated around the center axis below the target 23.

As can be seen from the above, the movement of the magnetic field can be realized with both electromagnets and permanent magnets. The electromagnets are preferable to the permanent magnets due to their higher flexibility.

The embodiments of the present invention will be described with reference to the drawings.

[First Embodiment]

In the first embodiment, an ordinary magnetron sputtering system is employed as shown in FIG. 1. An electromagnet method is adopted at the cathode section as shown in FIGS. 3A and 3B. $WSi_{2.8}$ is used as a target.

After a to-be-processed substrate 17 is mounted on the back surface of an anode 15, a chamber 11 is closed and an exhaust system (not shown) is activated to thereby evacuate the interior of the chamber 11 to about $10^{-6}$ Pa from an exhaust outlet 27.

A gas supply system (not shown) is then activated and Ar gas is supplied from a gas supply port 25. A conductance valve (not shown) is adjusted to maintain the pressure inside the chamber 11 at 8 mTorr.

Figure 5:
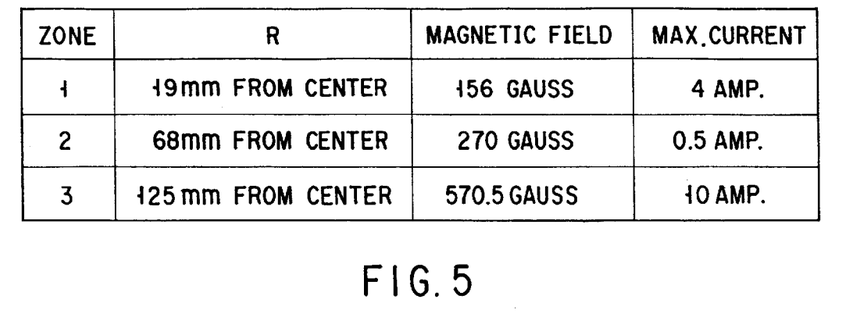
FIG. 5 is a table showing values of the magnetizing current and magnetic field of the magnetic field generation means in the first embodiment according to the present invention.

Next, a sputter power supply (not shown) is activated and 2.5 kW DC power is supplied to the cathode section 13. The magnetic field is generated by using three electromagnetic coils simultaneously. Magnetic-field values measured in three zones on the target surface at 100% magnetizing current (peak of alternating current) are shown in FIG. 5. A reference symbol R in FIG. 5 denotes a radius from the center of a certain position on the target 21.

Figure 6:
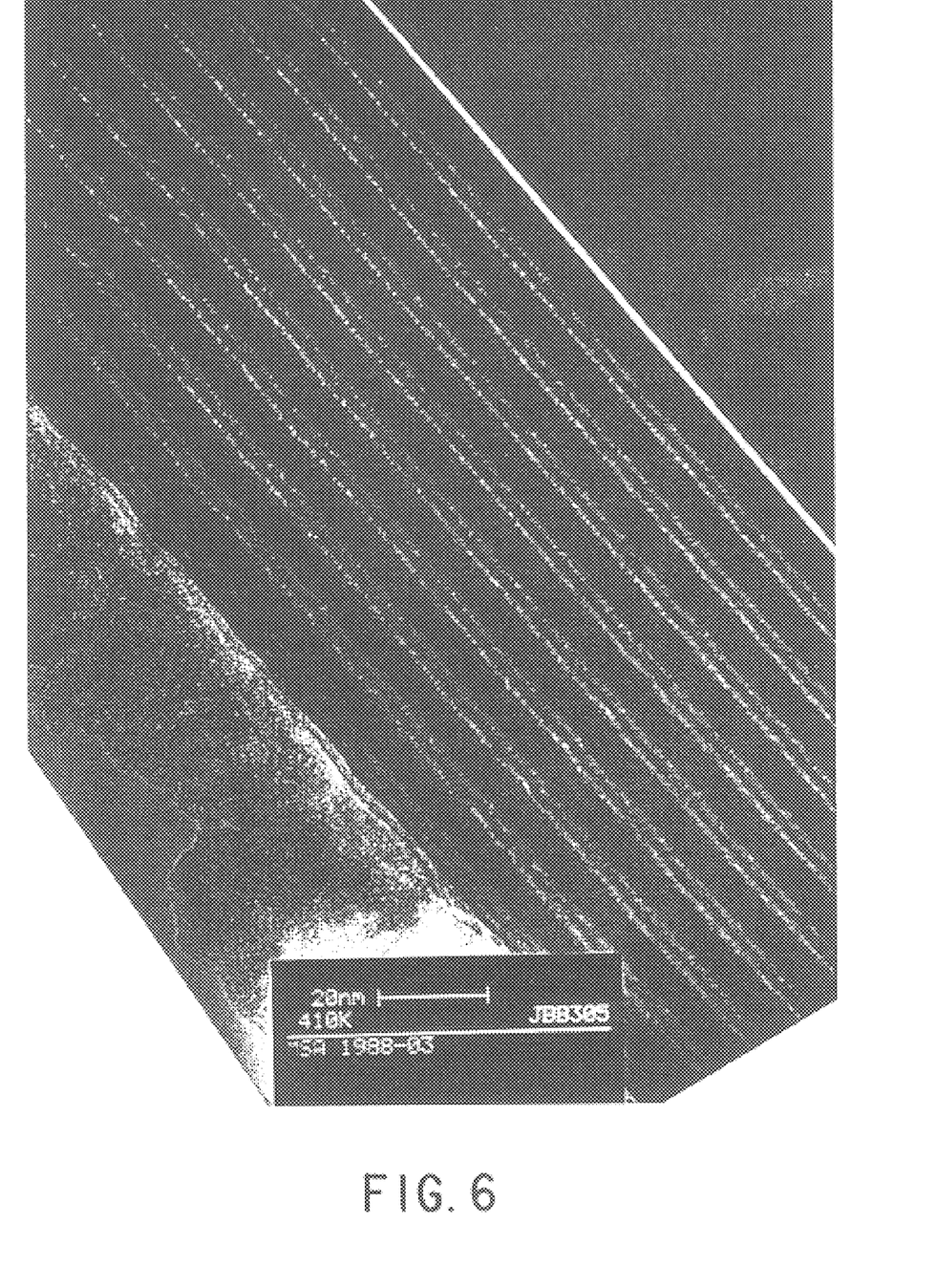
FIG. 6 is a cross-sectional TEM photograph of a thin film having repeated layers, in the first embodiment.

The magnetizing current of the electromagnets is swept at a cycle of four seconds in this state, and a WSi film is deposited on the to-be-processed substrate 17. FIG. 6 is a cross-sectional TEM (transmission electron microscope) photograph of a WSi film in case where magnet sweep time is four seconds. It illustrates that a regularly repeated layered film is formed.

Figure 7A:
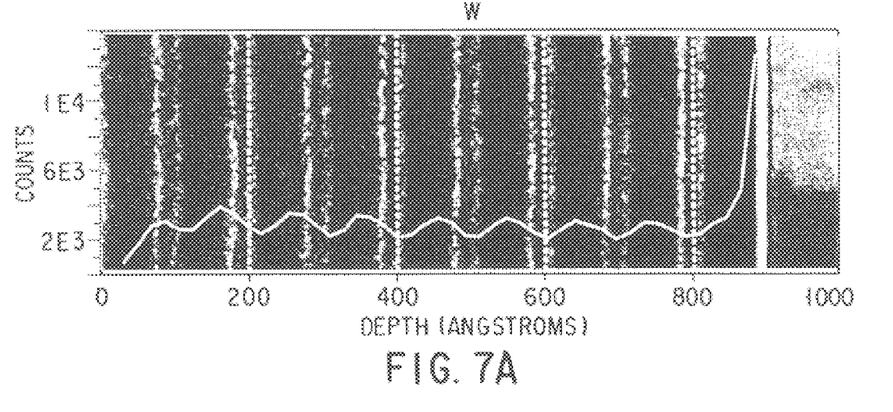
FIG. 7A shows W distribution of the thin film in the first embodiment by a W SIMS profile photograph overlaid on the cross-sectional TEM photograph.

FIG. 7A is a photograph showing that a profile by W SIMS (secondary ion mass spectrometry) is overlaid on the cross-sectional TEM photograph of the multilayer film (WSi). It illustrates that the peak of W coincides with the cycle of the multilayer film.

Figure 7B:
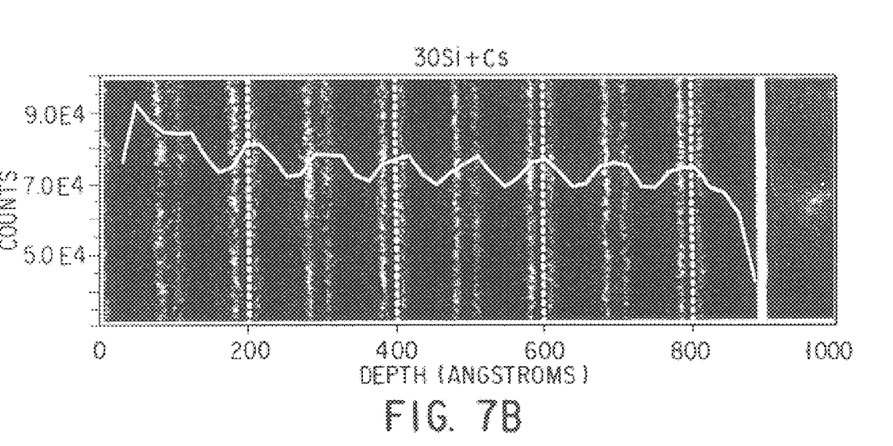
FIG. 7B shows Si distribution of the thin film in the first embodiment by an Si SIMS profile photograph overlaid on the cross-sectional TEM photograph.

FIG. 7B is a photograph showing that an Si SIMS profile is overlaid on the cross-sectional TEM photograph of the multilayer film. It illustrates that the peak of Si coincides with the cycle of the multilayer film.

As FIGS. 7A and 7B show, the multilayer film of FIG. 6 is one of which the main component of the composition is alternately switched between W and Si.

Figure 8:
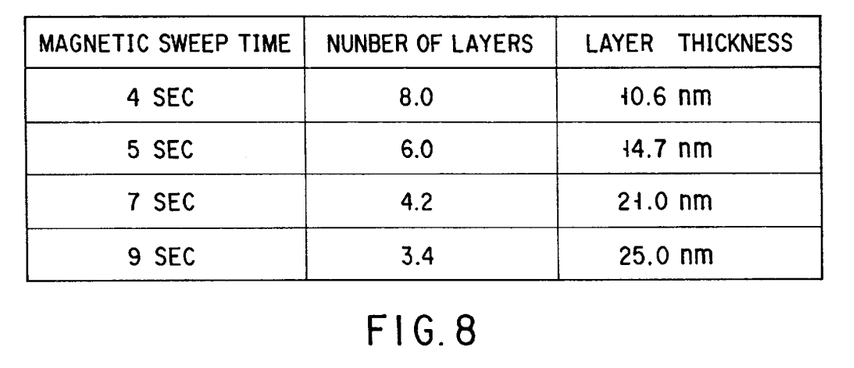
FIG. 8 is a table showing the number and thickness of layers included in a predetermined thickness film when changing magnet sweep time in the first embodiment.
Figure 9:
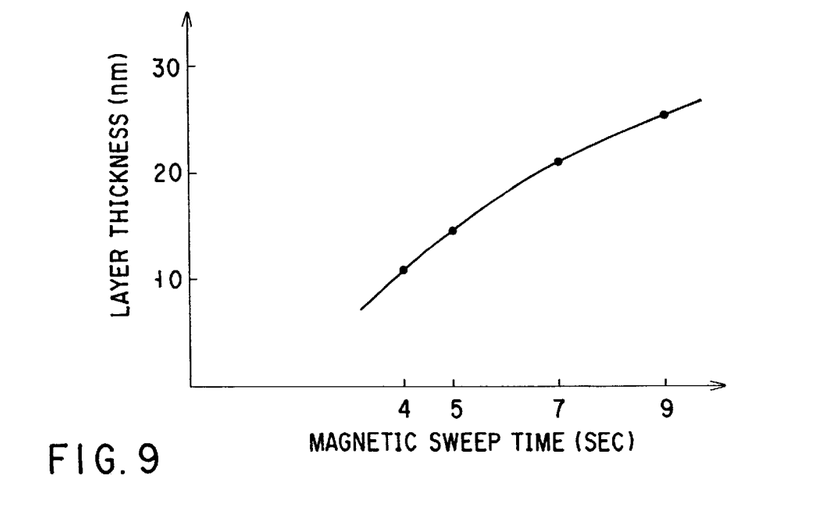
FIG. 9 is a graph showing the relationship between the magnet sweep time and layer thickness shown in FIG. 8.

The result of changing layer thickness by changing magnet sweep time will be introduced. FIG. 8 shows the number of layers and thicknesses of respective layers while magnet sweep time is changed and deposition is conducted for about 30 seconds under the above-stated system conditions. FIG. 9 is a graph derived from the result of FIG. 8. In this case, a layer is defined as one from a peak of W to the next peak. The overall thickness of the multilayer film which is deposited for 30 seconds is 85 nm.

FIG. 9 shows that the thickness of a unit layer is proportional to the magnet sweep time. The number of the layers contained in the same film thickness is therefore decreased inversely proportionally to the sweep time.

Figure 10A:
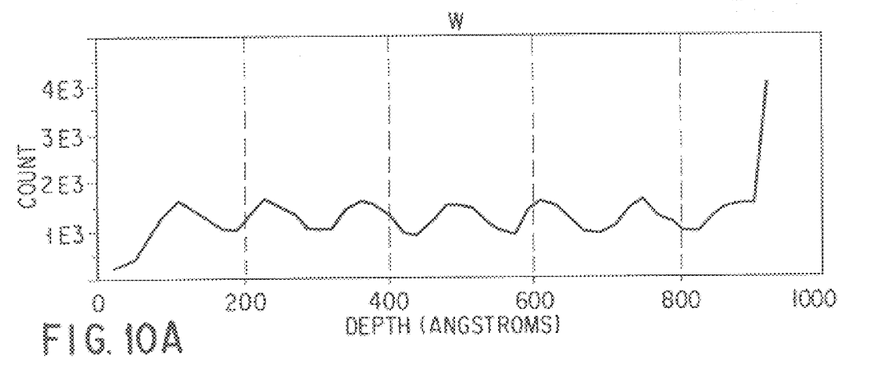
FIG. 10A is a W distribution photograph by means of SIMS in a WSi film formed by five-second sweep.
Figure 10B:
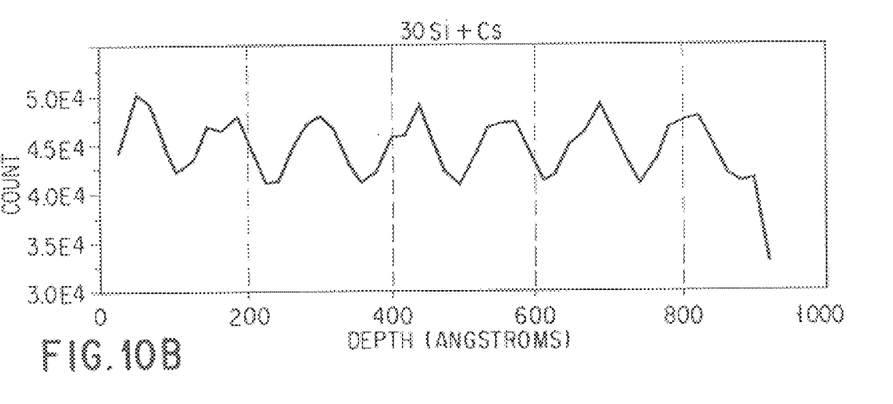
FIG. 10B is a Si distribution photograph by means of SIMS in a WSi film formed by five-second sweep.
Figure 10C:
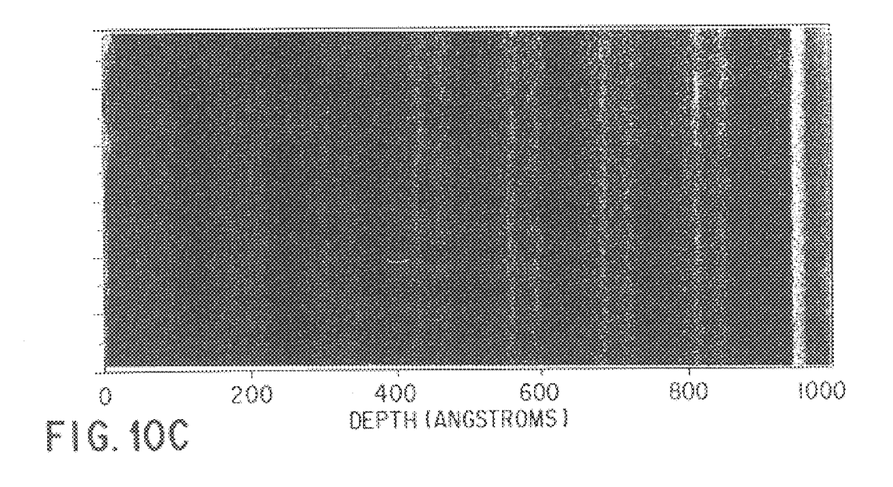
FIG. 10C is a cross-sectional photograph by means of TEM of a WSi film formed by five-second sweep.
Figure 11A:
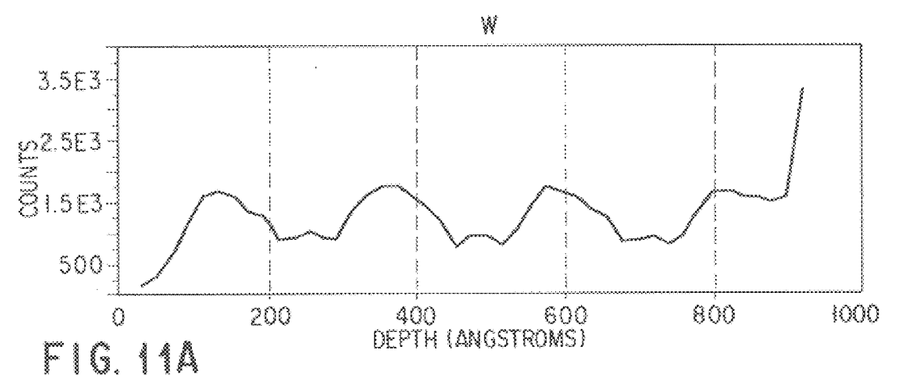
FIG. 11A is a W distribution photograph by means of SIMS in a WSi film formed by nine-second sweep.
Figure 11B:
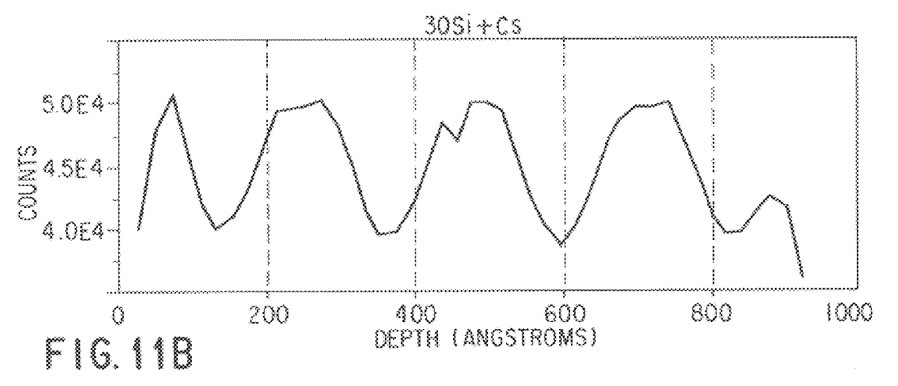
FIG. 11B is a Si distribution photograph by means of SIMS in a WSi film formed by nine-second sweep.
Figure 11C:
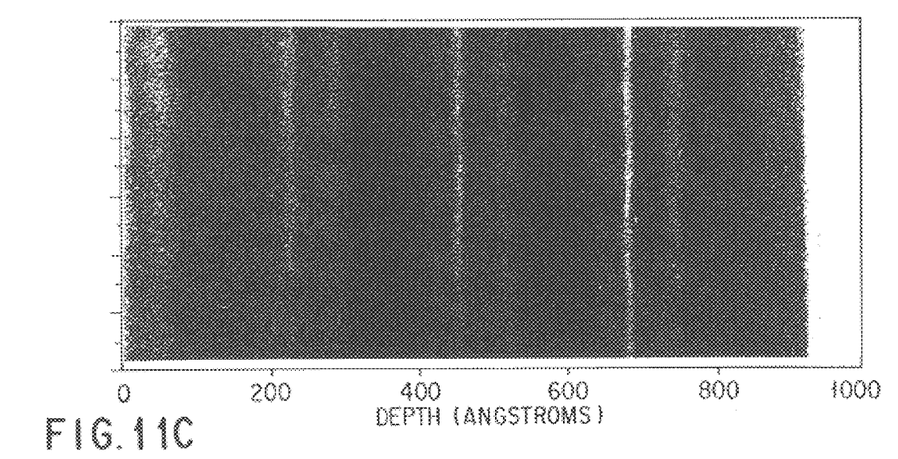
FIG. 11C is a cross-sectional photograph by means of TEM of a WSi film formed by nine-second sweep.

FIGS. 10A and 10B are graphs of composition change for the sweep time of five seconds, and FIG. 10C is a cross-sectional photograph. FIGS. 11A, 11B and 11C are those for the sweep time of nine seconds.

Those drawings illustrate that layers are finely controlled and have good periodicity. It is confirmed that the same number of layers are observed at the center and ends of the 8-inch width substrate deposited with the 13-inch round target.

The material used in the above experiment was tungsten silicide. In the present invention, a material is freely chosen from among those which sputtering rate of a certain component is made higher than those of other components by the magnetic field. An alloy of three or more elements can be used. This includes, for example, CoFe, CoCu, CoCr, FeCu, FeNi, MnNi and ternary combinations thereof as well as CoCrTa and FeNiCoMnCu.

[Second Embodiment]

According to the present invention, the relative composition of the deposited film is adjustable by changing magnetic force.

Figure 12:
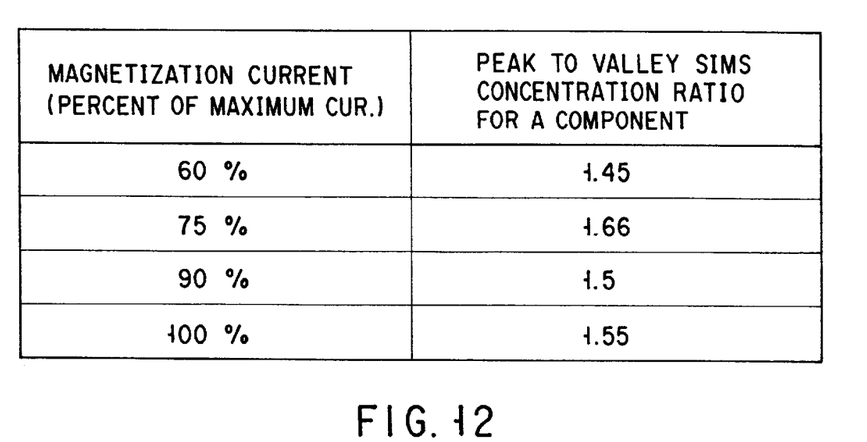
FIG. 12 is a table showing the relationship between the magnetizing current and the peak to valley SIMS concentration ratio for a component in the second embodiment according to the present invention.

In the second embodiment, a sputtering system of the same structure as that in the first embodiment is employed. The maximum value of magnetizing current is changed to thereby change the composition of the deposited film. As can be seen from FIGS. 10A, 10B or 11A, 11B, the multilayer film in the present invention has no zero content area for a component even in the valley of the profile. FIG. 12 illustrates a change in peak to valley SIMS concentration ratio for a component if the peak value of the magnetizing current is lowered from 100%. By lowering the magnetizing current by 40%, the peak to valley SIMS concentration ratio is changed from 1.45 to 1.66 by a maximum of 13%.

Figure 13:
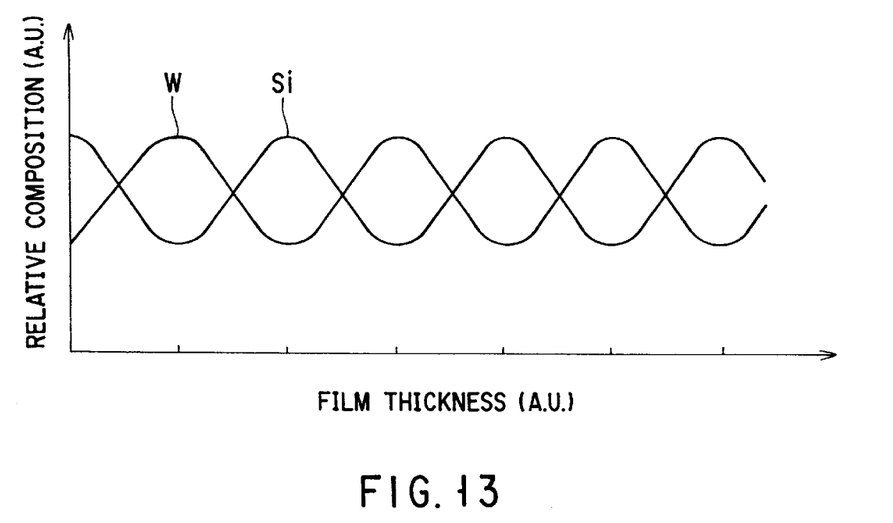
FIG. 13 is a view typically showing that the composition ratio of the thin film according to the present invention gradually changes in film thickness direction and that their main components are alternately switched.

As typically shown in FIG. 13, contents of the components of the multilayer film according to the present invention are gradually and periodically changed. The peaks of contents are alternately switched between the components in film thickness direction.

As described so far, according to the method of depositing a multilayer thin film of the present invention, multiple-element alloy is used for the target and the magnetic field of the magnetron sputtering system is changed, thus enabling a precision multilayer thin film to be manufactured easily. Owing to this, the present invention is applicable to optical gratings, a process of making a measurement standard, an X-ray Bragg-Fresnel lens using Al-Ag, a multilayer reflection mask using Mo-Si and the like.

Furthermore, the present invention is applicable to a magnetic resistance head requiring a very thin, repeated layers of two or more different materials. In that case, such combinations as CoFe, CoCu, CoCr, FeCu, FeNi, MnNi and ternary combinations thereof as well as CoCrTa FeNiCoMnCu can be used.

Moreover, if RF power is employed, the deposition of a multilayer film of composite insulating films is possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A thin film deposition method comprising the steps of:
   preparing a magnetron sputtering system having magnetic field generation means for changing a magnetic field to be applied to a target from an underside thereof;
   mounting, as said target, a monolithic compound material including not less than two components on a cathode of said magnetron sputtering system;
   providing a to-be-processed substrate on an anode of said magnetron sputtering system to oppose said target from an upper side;
   evacuating a chamber of said magnetron sputtering system and thereafter filling said chamber with inert gas;
   generating, by use of a peak magnet force of said magnetic field, a local erosion on said target, by applying, onto said cathode, a power selected from the group consisting of DC and RF power; and
   sweeping a position of said peak magnet force of said magnetic field under said target, to move a position of said local erosion by a distance larger than a size of said substrate in a sweeping direction such that said local erosion passes though at least under a portion of said substrate and change a ratio of not less than two components of said thin film in a film thickness direction of said thin film, by alternating said magnetic field from a region below said target.

2. A thin film deposition method according to claim 1, wherein said magnetic field generation means has an electromagnet, and said step of sweeping a position of said peak magnetic force of said magnetic field includes a step of changing a cycle of magnetizing current of said electromagnet.

3. A thin film deposition method according to claim 1, wherein said magnetic field generation means has a permanent magnet, and said step of sweeping a position of said peak magnetic force of said magnet field includes a step of controlling a cycle of moving said permanent magnet below said target.

4. A multilayer thin film deposition method according to claim 1, wherein said monolithic compound material serving as said target is a compound metal including not less than two metal elements.

5. A thin film deposition method according to claim 4, wherein said compound metal is one selected from the group consisting of WSi, CoFe, CoCu, CoCr, FeCu, FeNi, MnNi, ternary combinations of three components, CoCrTa and FeNiCoMnCu, said three components of said ternary combination being selected from the group consisting of Co, Fe, Cu, Cr, Ni and Mn.

6. A thin film deposition method according to claim 1, wherein said peak magnetic force position of said magnetic field moves across said target and a size of said substrate is smaller than that of said target.

7. A thin film deposition method according to claim 1, wherein said step of sweeping a position of said peak magnetic force of said magnet field includes a step of depositing said thin film having a multilayered structure while using different sputtering directivity of said not less than two components in magnetron sputtering.

8. A thin film deposition method comprising the steps
   preparing a magnetron sputtering system having magnetic field generation means for changing a magnetic field to be applied to a target from an underside thereof;
   mounting, as said target, a monolithic compound material including not less than two components on a cathode of said magnetron sputtering system;
   providing a to-be-processed substrate on an anode of said magnetron sputtering system to oppose said target from an upper side;
   evacuating a chamber of said magnetron sputtering system and thereafter filling said chamber with inert gas;
   generating, by use of a peak magnet force of said magnetic field, a local erosion on said target, by applying, onto said cathode, a power selected from the group consisting of DC and RF power; and
   sweeping a position showing said maximum value of said magnetic field under said target by applying an alternating magnetic field having a predetermined maximum value from a region below said target, to move a position of said local erosion by a distance larger than a size of said substrate in a sweeping direction such that said local erosion passing through at least under a portion of said substrate and obtain a predetermined composition change in a film thickness direction of said thin film.

9. A thin film deposition method according to claim 8, wherein said magnetic field generation means has an electromagnet, and said step of applying said alternating magnetic field includes a step of changing a maximum value of said alternating magnetic field by changing magnetizing current of said electromagnet.

10. A thin film deposition method according to claim 8, wherein said monolithic compound material serving as said target is a compound metal including not less than two metal elements.

11. A thin film deposition method according to claim 10, wherein said compound metal is one selected from the group consisting of WSi, CoFe, CoCu, CoCr, FeCu, FeNi, MnNi, ternary combinations of three components, CoCrTa and FeNiCoMnCu, said three components of said ternary combination being selected from the group consisting of Co, Fe, Cu, Cr, Ni and Mn.

* * * * *